United States Patent
Nouri et al.

(10) Patent No.: US 9,663,872 B2
(45) Date of Patent: May 30, 2017

(54) DIRECTIONAL SOLIDIFICATION SYSTEM AND METHOD

(71) Applicant: Silicor Materials Inc., San Jose, CA (US)

(72) Inventors: Abdallah Nouri, Montreal (CA); Alain Turenne, Kitchener (CA)

(73) Assignee: Silicor Materials, Inc., San Jose, CA (US)

( * ) Notice: Subject to any disclaimer, the term of this patent is extended or adjusted under 35 U.S.C. 154(b) by 0 days.

(21) Appl. No.: 14/776,536

(22) PCT Filed: Mar. 13, 2014

(86) PCT No.: PCT/IB2014/001147
§ 371 (c)(1),
(2) Date: Sep. 14, 2015

(87) PCT Pub. No.: WO2014/140901
PCT Pub. Date: Sep. 18, 2014

(65) Prior Publication Data
US 2016/0032482 A1  Feb. 4, 2016

Related U.S. Application Data

(60) Provisional application No. 61/784,838, filed on Mar. 14, 2013.

(51) Int. Cl.
*C03B 11/00* (2006.01)
*C30B 11/00* (2006.01)
(Continued)

(52) U.S. Cl.
CPC ......... *C30B 11/002* (2013.01); *C30B 11/003* (2013.01); *C30B 11/02* (2013.01);
(Continued)

(58) Field of Classification Search
CPC .......... C30B 11/00; C30B 11/02; H01L 31/18
(Continued)

(56) References Cited

U.S. PATENT DOCUMENTS 3,752,638 A   8/1973   Van Laar et al.
5,254,300 A   10/1993  Priewasser et al.
(Continued)

FOREIGN PATENT DOCUMENTS

CN   101133191 A   2/2008
CN   101928003 A   12/2010
(Continued)

OTHER PUBLICATIONS

"U.S. Appl. No. 13/234,960, Notice of Allowance mailed Jan. 29, 2016", 6 pgs.
(Continued)

*Primary Examiner* — Mark Halpern
(74) *Attorney, Agent, or Firm* — Schwegman Lundberg & Woessner, P.A.

(57) ABSTRACT

The present invention relates to an apparatus and method for purifying materials using a rapid directional solidification. Devices and methods shown provide control over a temperature gradient and cooling rate during directional solidification, which results in a material of higher purity. The apparatus and methods of the present invention can be used to make silicon material for use in solar applications such as solar cells.

6 Claims, 5 Drawing Sheets

(51) Int. Cl.
H01L 31/18 (2006.01)
C30B 11/02 (2006.01)

(52) U.S. Cl.
CPC ........ *H01L 31/182* (2013.01); *H01L 31/1804* (2013.01); *Y02E 10/546* (2013.01); *Y02P 70/521* (2015.11)

(58) Field of Classification Search
USPC .................................. 65/83, 374.13, 374.15
See application file for complete search history.

(56) References Cited

U.S. PATENT DOCUMENTS

| | | | |
|---|---|---|---|
| 5,553,656 | A | 9/1996 | Cook |
| 5,961,944 | A | 10/1999 | Aratani et al. |
| 6,136,091 | A | 10/2000 | Yamazaki et al. |
| 6,378,835 | B1 | 4/2002 | Wakita et al. |
| 6,712,904 | B1 | 3/2004 | Sonnenberg et al. |
| 8,268,074 | B2 | 9/2012 | Hugo |
| 8,562,740 | B2 | 10/2013 | Nichol et al. |
| 9,352,389 | B2 | 5/2016 | Nouri et al. |
| 2004/0187767 | A1 | 9/2004 | Chandra et al. |
| 2006/0000409 | A1 | 1/2006 | Spangler et al. |
| 2007/0227189 | A1 | 10/2007 | Sakai |
| 2008/0257254 | A1 | 10/2008 | Linke et al. |
| 2009/0020067 | A1 | 1/2009 | Su et al. |
| 2009/0158995 | A1 | 6/2009 | Lew |
| 2010/0203350 | A1 | 8/2010 | Stoddard et al. |
| 2010/0294198 | A1 | 11/2010 | Wan |
| 2011/0259316 | A1 | 10/2011 | Pelletier et al. |
| 2012/0040139 | A1 | 2/2012 | Garandet et al. |
| 2012/0067540 | A1 | 3/2012 | Nouri et al. |
| 2012/0119407 | A1 | 5/2012 | Nichol et al. |
| 2016/0271692 | A1 | 9/2016 | Nouri et al. |

FOREIGN PATENT DOCUMENTS

| | | |
|---|---|---|
| CN | 102080259 A | 6/2011 |
| CN | 102701213 A | 10/2012 |
| CN | 103813983 B | 6/2016 |
| CN | 105964992 A | 9/2016 |
| DE | 19912484 A1 | 9/2000 |
| EP | 0939146 A1 | 9/1999 |
| JP | 2016513616 A | 5/2016 |
| WO | WO-2008/086705 A1 | 7/2008 |
| WO | WO-2010/069784 A1 | 6/2010 |
| WO | WO-2011/009062 A2 | 1/2011 |
| WO | WO-2012/025905 A1 | 3/2012 |
| WO | WO-2013040410 A1 | 3/2013 |
| WO | WO-2014/140901 A2 | 9/2014 |
| WO | WO-2014/140901 A3 | 9/2014 |

OTHER PUBLICATIONS

"U.S. Appl. No. 15/166,039, Preliminary Amendment filed May 31, 2016", 5 pgs.
"Chinese Application Serial No. 201280044634.6, Response filed Mar. 18, 2016 to Telephone Conversation with Examiner on Feb. 18, 2016", (w English Translation of Claims), 17 pgs.
"U.S. Appl. No. 13/234,690, Non Final Office Action mailed May 24, 2012", 11 pgs.
"U.S. Appl. No. 13/234,960, Advisory Action mailed Feb. 5, 2014", 3 pgs.
"U.S. Appl. No. 13/234,960, Final Office Action mailed Aug. 6, 2015", 10 pgs.
"U.S. Appl. No. 13/234,960, Final Office Action mailed Nov. 8, 2013", 15 pgs.
"U.S. Appl. No. 13/234,960, Final Office Action mailed Dec. 20, 2012", 14 pgs.
"U.S. Appl. No. 13/234,960, Non Final Office Action mailed Apr. 26, 2013", 14 pgs.
"U.S. Appl. No. 13/234,960, Non-Final Office Action mailed Jan. 16, 2015", 10 pgs.
"U.S. Appl. No. 13/234,960, Preliminary Amendment filed Oct. 5, 2011", 5 pgs.
"U.S. Appl. No. 13/234,960, Response filed Jan. 5, 2016 to Final Office Action mailed Aug. 6, 2015", 5 pgs.
"U.S. Appl. No. 13/234,960, Response filed Mar. 20, 2013 to Final Office Action mailed Dec. 20, 2012", 9 pgs.
"U.S. Appl. No. 13/234,960, Response filed Apr. 16, 2015 to Non Final Office Action mailed Jan. 16, 2015", 7 pgs.
"U.S. Appl. No. 13/234,960, Response filed Jul. 19, 2013 to Non Final Office Action mailed Apr. 26, 2013", 9 pgs.
"U.S. Appl. No. 13/234,960, Response filed Aug. 24, 2012 to Non Final Office Action mailed May 24, 2012", 9 pgs.
"U.S. Appl. No. 13/234,960, Response filed Oct. 6, 2014 to Final Office Action mailed Nov. 8, 2013", 9 pgs.
"Chinese Application Serial No. 201280044634.6, Office Action mailed Jun. 24, 2015", (w/ English Translation), 15 pgs.
"Chinese Application Serial No. 201280044634.6, Response filed Jan. 4, 2016 to Office Action mailed Jun. 24, 2015", (w/ English Translation of Claims), 22 pgs.
"European Application Serial No. 12766799.6, Office Action mailed May 8, 2014", 2 pgs.
"European Application Serial No. 12766799.6, Response filed Oct. 14, 2014 to Office Action mailed May 8, 2014", 6 pgs.
"International Application Serial No. PCT/IB2014/001147, International Preliminary Report on Patentability mailed sep. 24, 2015", 11 pgs.
"International Application Serial No. PCT/IB2014/001147, International Search Report mailed Nov. 7, 2014", 5 pgs.
"International Application Serial No. PCT/IB2014/001147, Written Opinion mailed Nov. 7, 2014", 10 pgs.
"International Application Serial No. PCT/US2012/055510, International Preliminary Report on Patentability mailed Mar. 27, 2014", 7 pgs.
"International Application Serial No. PCT/US2012/055510, International Search Report mailed Dec. 14, 2012", 4 pgs.
"International Application Serial No. PCT/US2012/055510, Written Opinion mailed Dec. 14, 2012", 5 pgs.
Kwiecinska, B., et al., "Graphite, semi-graphite, natural coke, and natural char classification-ICCP system", *International Journal of Coal Geology*, 57(2), (2004), 99-116.
U.S. Appl. No. 13/234,960, filed Sep. 16, 2011, Directional Solidification System and Method.

DIRECTIONAL SOLIDIFICATION SYSTEM AND METHOD

CLAIM OF PRIORITY

This application is a U.S. National Stage Filing under 35 U.S.C. 371 from International Application No. PCT/IB2014/001147, filed on Mar. 13, 2014, and published as WO 2014/140901 A2 on Sep. 18, 2014, which claims the benefit of priority to U.S. Provisional Patent Application No. 61/784,838, filed Mar. 14, 2013, which are incorporated herein by reference in their entireties.

BACKGROUND

Solar cells can be a viable energy source by utilizing their ability to convert sunlight to electrical energy. Silicon is a semiconductor material and the raw incoming material used in the manufacture of solar cells; The electrical properties of the cells, namely the conversion efficiency depends critically on the purity of the Silicon. Several techniques have been used to purify Silicon. The most well known technique is called 'Siemens process'. This technique allows to almost remove every single impurity present within the Silicon. However, this technique requires to produce the silicon into a gas phase and redeposit into a solid phase in order to remove the impurities. The technique describes in this patent allows to remove very effectively impurities by melting the Silicon into a liquid phase and solidifying the Silicon using a technique called 'directional solidification'. While this technique is very well known, this patent focuses on a new way to use the directional solidification that allows to reduce considerably the cost of this procedure.

Techniques used to make purified silicon crystals for solar cells are known. Most of these techniques operate on the principle that while silicon crystals are solidifying from a molten silicon solution, undesirable impurities remain in the molten solution. A first example technique, the float zone technique, can be used to make silicon monocrystalline ingots using a moving liquid to urge impurities toward an edge of a mold for removal. Another example technique, the Czochralski technique, can be used to make silicon monocrystalline ingots using a seed crystal that is slowly pulled out of a molten solution, allowing the formation of a monocrystalline column of silicon while leaving impurities in the solution. Further example techniques, such as the Bridgeman or heat exchanger techniques, can be used to make silicon multicrystalline ingots through the creation of a temperature gradient with a controlled cooling rate, causing directional solidification.

BRIEF DESCRIPTION OF THE DRAWINGS

In the drawings, like numerals can be used to describe similar elements throughout the several views. Like numerals having different letter suffixes can be used to represent different views of similar elements. The drawings illustrate generally, by way of example, but not by way of limitation, various embodiments discussed in the present document.

DETAILED DESCRIPTION

Figure 1:
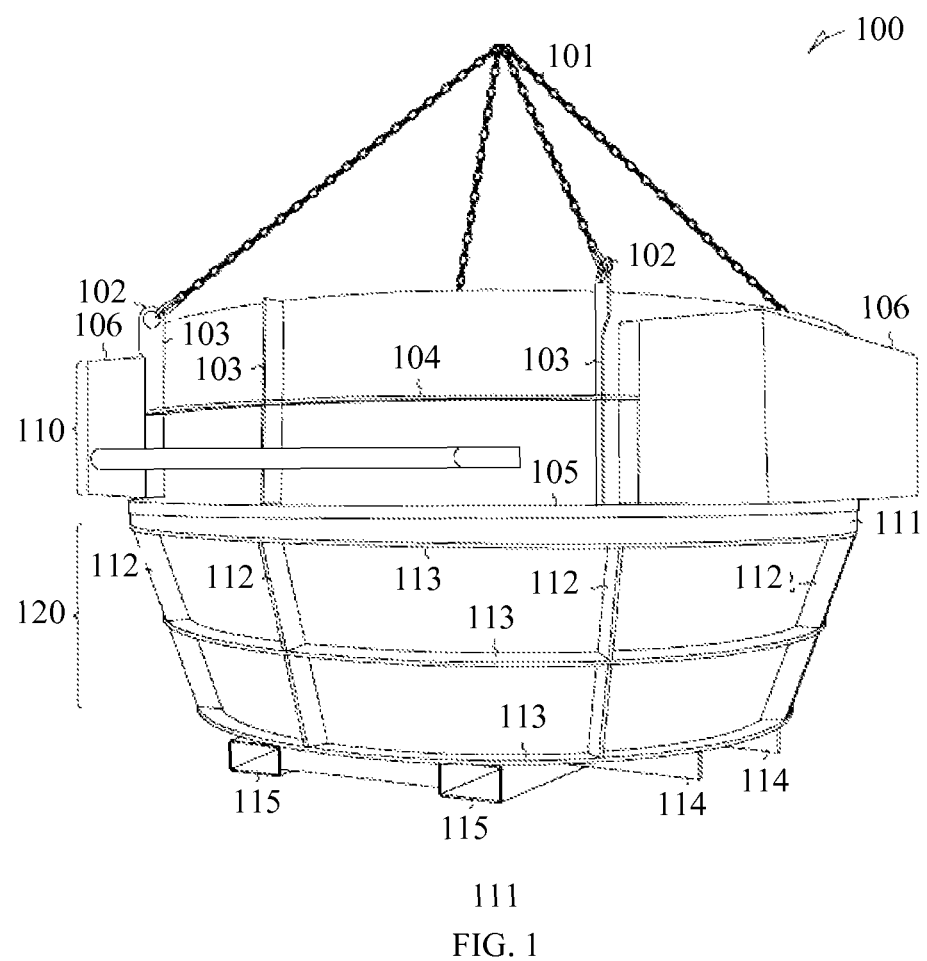
FIG. 1 shows an isometric view of a system according to at least one embodiment of the invention.

In the following detailed description, reference is made to the accompanying drawings. The drawings form a part of the description and are provided by way of illustration, but not of limitation. The drawing embodiments are described in sufficient detail to enable those skilled in the art to practice the present subject matter. Other embodiments may be utilized and mechanical, structural, or material changes may be made without departing from the scope of the present patent document.

Reference will now be made in detail to certain examples of the disclosed subject matter, some of which are illustrated in the accompanying drawings. While the disclosed subject matter will largely be described in conjunction with the accompanying drawings, it should be understood that such descriptions are not intended to limit the disclosed subject matter to those drawings. On the contrary, the disclosed subject matter is intended to cover all alternatives, modifications, and equivalents, which can be included within the scope of the presently disclosed subject matter, as defined by the claims.

References in the specification to "one embodiment", "an embodiment", "an example embodiment", etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In this document, the terms "a" or "an" are used to include one or more than one and the term "or" is used to refer to a nonexclusive "or" unless otherwise indicated. In addition, it is to be understood that the phraseology or terminology employed herein, and not otherwise defined, is for the purpose of description only and not of limitation.

The present subject matter relates to molds, mold systems, and related methods for purifying silicon using directional solidification techniques, while maintaining a consistent progression of a solid-liquid interface throughout a mold. The purified silicon resulting from the directional solidification can be used in solar cells. It has been found that by controlling the temperature gradient within the mold, a highly controlled directional solidification can be accomplished. Although purification of silicon is described in the most detail in examples below, systems and methods described can also be used for directional solidification and purification of other materials such as sapphire.

Directional crystallization generally proceeds from bottom to top, thus the desired temperature gradient has a lower temperature at the bottom and a higher temperature at the top. High degrees of control over the temperature gradient and the corresponding directional crystallization can advantageously allow a more effective directional solidification, resulting in silicon of higher purity.

FIG. 1 illustrates a specific embodiment of a mold system 100 for directional solidification of silicon. The system can include a top heater 110 positioned on or near a top portion of a mold 120. The top heater 110 can be support by one or more chains 101, which are engaged on first ends with holes 102 of vertical structural members 103. The chains 101 in this example form a bridle, allowing the top heater 110 to be moved by the use of a crane or other lifting system. The system 100 can also be moved, for example, by placing the mold 120 on a fork or scissor lift while leaving the top heater 110 over the mold 120. Screen boxes 106 can enclose ends of the top heater's 110 heating members that protrude from an outer mold jacket, protecting users from the heat and electricity present in and near the ends of these members.

The vertical structural members 103 can extend from a bottom edge of the top heater 110 to a top edge of the top heater 110. The vertical structural members 103 can be located on an outer surface of the top heater's 110 outer mold jacket and can extend outward in a direction perpendicular to the outer surface. The top heater can also include a horizontal structural member 104 located on the outer surface of the top heater's 110 outer mold jacket and can extend outward in a direction perpendicular to the outer surface.

The top heater 110 can include a lip 105 that forms a part of the heater's outer mold jacket. The lip can protrude outward from the outer mold jacket and can extend inward toward a center axis of the top heater 110 such that it covers a thickness of any present insulation. Alternatively, the lip 105 can extend inward only, enough to cover the bottom edge of the top heater's 110 outer mold jacket.

In the embodiment depicted in FIG. 1, insulation 111 from the mold 120 can extend between the top heater 110 and the mold 120. In various examples, at least part of one or more insulating layers 111 of the mold 120 can extend above the height of the mold's outer jacket. Similar to the top heater 110, the mold 120 can include vertical structural members 112. The vertical structural members 112 can be located on an outer surface of the mold's 120 outer jacket and can extend outward in a direction perpendicular to the outer surface. The vertical structural members 112 can extend from the bottom edge of the mold 120 to the top edge of the mold 120. The mold 112 can also include one or more horizontal structural members 113. The horizontal structural members 113 are shown on the outer surface of the outer jacket of the mold 120, extending outward from the outer mold jacket. The horizontal structural members 113 can extend horizontally around a circumference of a cylindrical mold 112 or along one or more sides of a non-cylindrical mold. The mold 112 can also include criss-crossing bottom structural members 114, 115. The bottom structural members 114, 115 can extend across the bottom of the mold 112. Some of the bottom structural members 115 can be shaped and sized to allow a fork or scissors lift or other machine to physically manipulate (e.g., move) the system 100.

Figure 2:
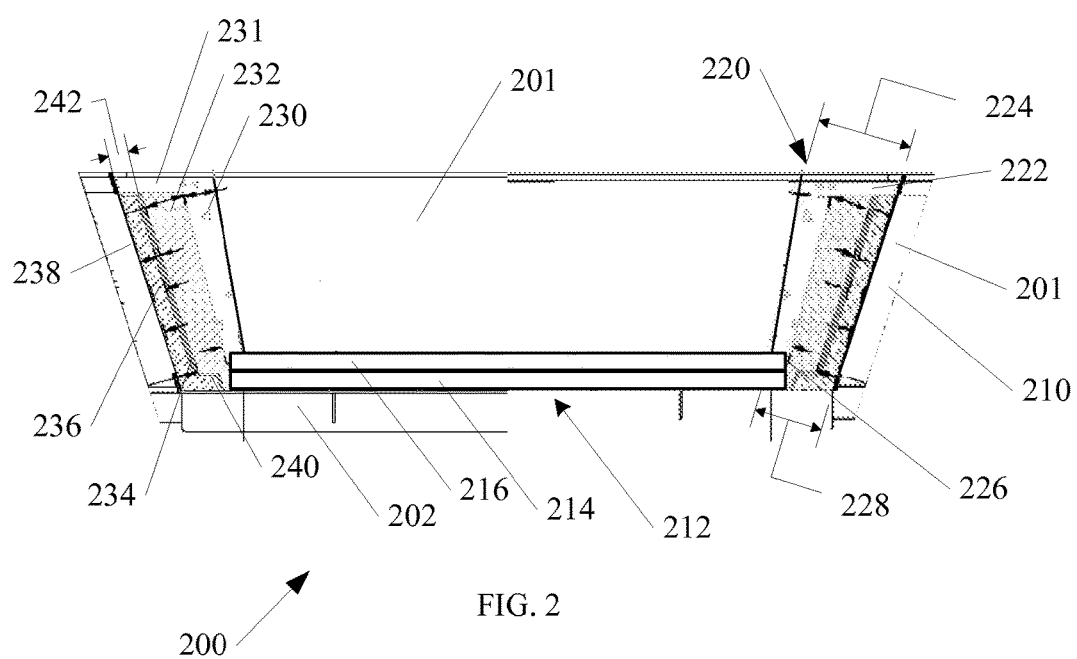
FIG. 2 shows a cross section of a mold according to at least one embodiment of the invention.

FIG. 2 shows a mold 200 according to an embodiment of the invention. The mold 200 includes an outer mold jacket 210, including side walls 201 and a floor 202, that encloses a bottom 212 and a wall insulation structure 220. In one example, the side walls 201 and the floor 202 are integrally formed. In another example, the side walls 201 and the floor 202 are bolted, or otherwise mechanically connected together to form the outer mold jacket 210.

The mold 200 defines an interior portion 201 within the mold 200 to contain an amount of molten silicon. In one example, the wall insulation structure 220 is a composite structure including a number of different materials positioned next to each other. One advantage of a composite wall insulation structure 220 includes the ability to control a thermal gradient by selection of materials and geometry of the individual components of the composite structure. Another advantage of a composite wall insulation structure 220 includes the ability to reduce cost of the mold. Higher cost, high heat resistance materials are used on exposed surfaces where molten silicon will be contacted, while lower cost materials with lower heat resistance are layered as the composite structure progresses away from the molten silicon.

In one example, the wall insulation structure 220 tapers in thickness from a rim 222 of the mold 200, having a first thickness 224, to a bottom interface 226 with the bottom 212, having a second thickness 228 that is thinner than the first thickness 224. In one example the second thickness is approximately 25 percent thinner than the first thickness. In operation, the taper of the wall insulation structure 220 provides a thermal gradient that provides a desirable progression of the liquid-solid interface in the silicon during directional solidification. In one example, the taper of the wall insulation structure 220 provides more insulation near a top of the melt to keep the surface of the melt in a liquid state, while less insulation is provided near the bottom interface with the bottom 212, to facilitate cooling at the bottom of the mold 200.

In one example, the wall insulation structure 220 includes an exposed layer 230 that will be in direct contact with the molten silicon in a directional solidification operation. In one example, the exposed layer 230 is substantially continuous (in contrast, to an assembled brick layer or the like) to contain the molten silicon. One material that includes good thermal properties includes aluminum oxide in a form such as $Al_2O_3$. In one example, the aluminum oxide is substantially pure $Al_2O_3$, which minimizes impurities from the exposed layer 230 into the silicon melt. In one example, the $Al_2O_3$ is greater than 98 percent pure $Al_2O_3$. In one example, the exposed layer 230 wraps over a top surface 231 of the wall insulation structure 220. A feature of this configuration includes protection for inner structures or layers within the wall insulation structure 220 that may not have thermal resistance to temperatures as high as the exposed layer 230. Another feature of this configuration includes isolation of the molten silicon from potential contaminants that may be contained in other layers within the wall insulation structure 220.

In one example, the wall insulation structure 220 further includes a layer of refractory bricks 232 forming an interface with the exposed layer 230. In one example, the layer of refractory bricks 232 include $Al_2O_3$. Refractory bricks 232 can provide desirable structural properties such as toughness to the wall insulation structure 220. In one example, the layer of refractory bricks 232 includes bricks that are rated to 1540° C. or less. In one example, the layer of refractory bricks 232 includes bricks that are rated to 1430° C. or less. A combination of properties are taken into consideration in selection of refractory bricks 232, such as thickness and thermal properties needed for the desired gradient of the molten silicon, and other properties such as cost, strength, and toughness.

In one example, the wall insulation structure 220 further includes a microporous refractory layer 236. In one example, the microporous refractory layer 236 is rated to 1000° C. or less. Pores in the microporous refractory layer 236 provide good insulating properties. In selected examples layers of ceramic fiber insulation are further included between selected layers. In one example, a first ceramic fiber layer 238 is included between the outer mold jacket 210 and the microporous refractory layer 236. In one example, a second ceramic fiber layer 234 is included between the microporous refractory layer 236 and the layer of refractory bricks 232. Examples of ceramic fiber layers include boards, flexible fabrics, or other configurations.

In one example one or more layers in the wall insulation structure 220 taper from a rim 222 of the wall insulation structure 220 to a bottom 226 of the wall insulation structure 220, where the wall insulation structure 220 forms an interface with the bottom 212. In the example shown in FIG. 2, both the exposed layer 230 and the layer of refractory bricks 232 taper from the rim 222 to the bottom 226, while the microporous refractory layer 236 maintains a consistent thickness 242. In one example the microporous refractory layer 236 maintains a consistent thickness 242 along the outer mold jacket 210, and also around a corner 240 over at least part of the bottom of the outer mold jacket 210. This configuration provides precise control of the cooling rate of the silicon.

In one example, the bottom 212 includes one or more heat conducting layers. In the example shown in FIG. 2, two heat conducting layers are shown. A graphite containing layer 214 is shown, and a silicon carbide layer 216 is shown. Materials such as silicon carbide and graphite possess a desirable property of high thermal conductivity, and high heat resistance. In the example shown, the bottom 212 conducts heat from the silicon melt out the bottom of the mold 200, without melting itself, or contaminating the silicon. Although two layers 214, 216 are shown, other embodiments may include more than two layers, or only a single layer.

In one example, the graphite containing layer 214 includes semi graphite, although the invention is not so limited. In one example, the graphite containing layer 214 includes densified graphite. graphite containing layer 214 includes double densified graphite. In one example, the graphite containing layer 214 is formed using a number of graphite bricks assembled into a layer. Other examples include a continuous graphite sheet, or a cast graphite layer. In one example the graphite containing layer 214 is between approximately 1 to 2 inches in thickness. In one example the graphite containing layer 214 is approximately 2 inches in thickness.

In one example, the silicon carbide layer 216 is formed using a number of silicon carbide bricks assembled into a layer. In one example, the silicon carbide layer 216 is a continuous silicon carbide sheet. In one example, the silicon carbide layer 216 is cast in place. In one example the silicon carbide layer 216 is between approximately 2 to 3 inches in thickness. In one example the silicon carbide layer 216 is approximately 2.5 inches in thickness. In one example, the silicon carbide layer 216 includes approximately 80% by weight silicon carbide cast in a refractory binder material.

In the example shown in FIG. 2, the silicon carbide layer 216 is formed over the graphite containing layer 214. In such a configuration, the silicon carbide layer 216 may provide a barrier to potential impurities that may be included in subsequent layers such as the graphite containing layer 214.

In the example shown in FIG. 2, the graphite containing layer 214 is located adjacent to a bottom of the outer mold jacket 210. In such a configuration, the graphite containing layer 214 may provide increased thermal conductivity to the outer mold jacket 210 and to cooling fins located on the outer mold jacket 210, as described in more detail below. In one example, configurations of molds and mold systems described in the present disclosure are capable of moving a solidification front at a rate of approximately 1-2 centimeters per hour. In one example, configurations of molds and mold systems described in the present disclosure are capable of moving a solidification front at a rate of up to approximately 10 centimeters per hour.

Figure 3:
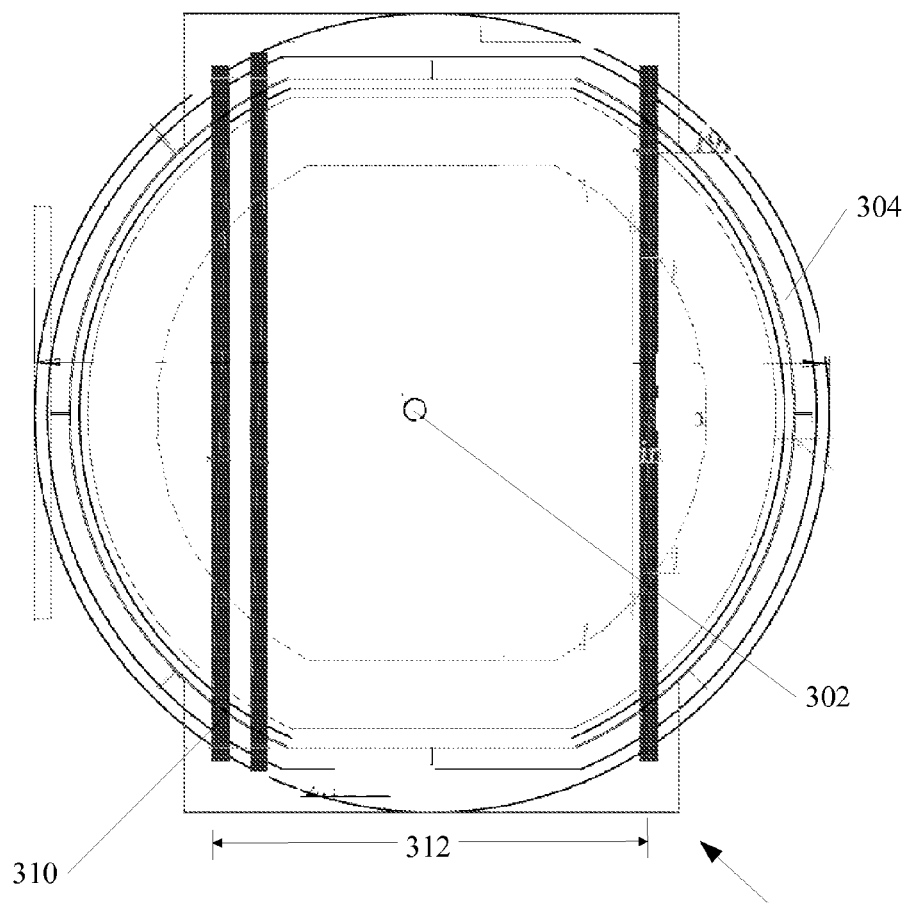
FIG. 3 shows a top view of a heater according to at least one embodiment of the invention.

FIG. 3 illustrates a top heater 300 that may further facilitate keeping a top surface of a silicon melt in a liquid state, while solidification desirably progresses from the bottom to the top of the mold. The top heater 300 can include one or more heating members 310. Each of the one or more heating members can independently include any suitable material. For example, each of the one or more heating members 310 independently can include a heating element, where the heating element can include silicon carbide, molybdenum disilicide, graphite, copper, or a combination thereof; and, each of the one or more heating members can alternatively independently include an induction heater. In one embodiment, the one or more heating members 310 are positioned at approximately the same height. In another embodiment, the one or more heating members are positioned at different heights.

In one example, the top heater 300 includes 12 heating members 310. In one example, the 12 heating members 310 are spaced approximately equally apart over a distance 312. In one example, the distance 312 is approximately 54 inches. Variables such as the positioning of heating members and the number of heating members are important to the thermal gradients generated in the silicon during processing. Small variations in the thermal gradient may cause undesirable progression of portions of the liquid-solid interface in the silicon during directional solidification. For example it is undesirable to have a surface of the molten silicon solidify and trap a molten interior portion within the ingot. A trapped molten portion of silicon may contain an undesirable level of impurities that adversely affect performance of the resulting silicon material.

In addition to a number of heating members 310 and a lateral spacing of heating members 310, in one example, the number of heating members 310 are positioned to be a distance 314 of approximately 1.9 inches above a surface of a melt. In one example, a diameter of the heating members 310 is approximately 2 inches. As with a selected number of heating members 310 and lateral spacing of heating members 310, chosen dimensions such as diameter of the heating members 310 and distance above a surface of a melt have been discovered in the present disclosure to provide a desirable progression of portions of the liquid-solid interface in the silicon during directional solidification.

In one example, a vent hole 302 is provided in the top heater 300 to remove gasses such as oxygen from the heating member 310 and a surface of the silicon melt. In one example, a vacuum pump (not shown) is coupled to the vent hole 302 to remove the unwanted gasses through the vent hole 302. In one example, only a single vent hole 302 sized between approximately one to two inches in diameter is used in the top heater 300. In one example, the single vent hole 302 is approximately one inch in diameter. It has been discovered that variables such as a single vent hole of appropriate dimensions effectively removes unwanted gasses without leading to unwanted cooling of a surface of the silicon melt.

In one example, the heating elements include silicon carbide, which has certain advantages. For example, silicon carbide heating elements do not corrode at high temperatures in the presence of oxygen. Oxygen corrosion can be reduced for heating elements including corrodible materials by using a vacuum chamber, but silicon carbide heating elements can avoid corrosion without a vacuum chamber. Additionally, silicon carbide heating elements can be used without water-cooled leads, having multiple working zones, such as a cool zone at the edges, and a hot zone at the center of the heating element. In one embodiment, the heating elements are used in a vacuum chamber, with water-cooled leads, or both. In another embodiment, the heating elements are used without a vacuum chamber, without water-cooled leads, or without both.

In one embodiment, the one or more heating members 310 are induction heaters. The induction heaters can be cast into one or more refractory materials. The refractory material containing the induction heating coil or coils can then be positioned over the mold. The refractory material can be any suitable material. For example, the refractory material can include aluminum oxide, silicon oxide, magnesium oxide, calcium oxide, zirconium oxide, chromium oxide, silicon carbide, graphite, or a combination thereof. In another embodiment, the induction heaters are not cast into one or more refractory materials.

Figure 4:
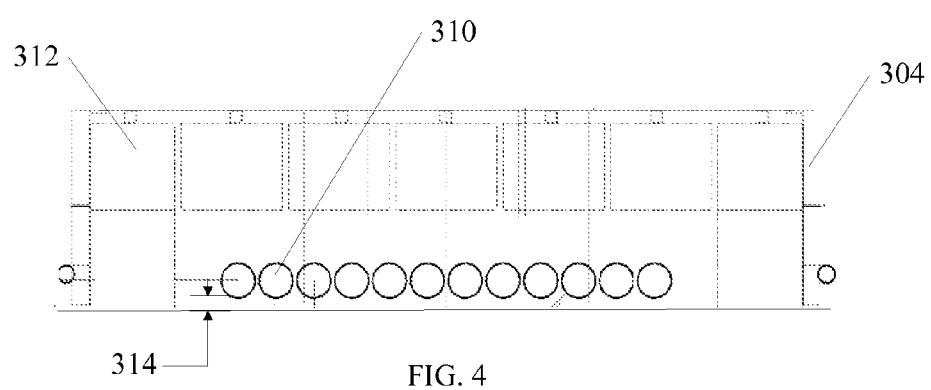
FIG. 4 shows a side view of a heater according to at least one embodiment of the invention.

The top heater can include insulation, for example top heater 300 shown in FIG. 4 includes insulation 316. The insulation can include any suitable insulating material. The insulation can include one or more insulating materials. For example, the insulation can include insulating brick, a refractory, a mixture of refractories, insulating board, ceramic paper, high temperature wool, cast insulating materials, or a mixture thereof. Insulating board can include high temperature ceramic board. In one example, the insulation 316 is cast around the heating members 310, making them more robust, and resistant to thermal shock to prevent deformation of parts around the heating members 310. One suitable cast material includes Kaolite® 3300 from Morgan Thermal Ceramics, Inc.

The top heater can include an outer jacket, for example top heater 300 shown in FIG. 3 includes outer jacket 304. The outer jacket can include any suitable material. For example, the outer jacket can include steel or stainless steel. In another embodiment, the outer jacket includes steel, stainless steel, copper, cast iron, a refractory material, a mixture of refractory materials, or a combination thereof. The insulation 316 is disposed at least partially between the one or more heating members and the outer jacket. In FIG. 4, the bottom edge of the outer jacket 304 is shown to be approximately even with the bottom edge of the insulation.

Variations in the top heater are possible, within the scope of the invention. For example, the edge of outer jacket 304 can extend below the edge of the insulation 316 and the one or more heating members 310. In another example, the edge of the outer jacket 304 can extend below the edge of the insulation 316, below the one or more heating members, or a combination thereof. In one example, the outer jacket 304 can extend below the bottom edge of the insulation 316 and continue across either fully or partially covering the bottom edge of the insulation. In some embodiments, the portion of the outer jacket 304 that covers the edge of the insulation can include a material with a relatively low conductivity, such as a suitable refractory, such as aluminum oxide, silicon oxide, magnesium oxide, calcium oxide, zirconium oxide, chromium oxide, silicon carbide, graphite, or a combination thereof. In another example, the outer jacket 304 does not extend below the bottom edge of the insulation or the height of the one or more heating members. In another embodiment, the outer jacket 304 extends below the height of the one or more heating members 310, but is still above the bottom edge of the insulation 316.

As discussed above, by controlling the temperature gradient in the apparatus, a highly controlled directional solidification can be accomplished. High degrees of control over the temperature gradient and the corresponding directional crystallization can allow a more effective directional solidification, providing a silicon of high purity. In the present invention, the directional crystallization proceeds from approximately bottom to top, thus the desired temperature gradient has a lower temperature at the bottom and a higher temperature at the top. In embodiments with a top heater, the top heater is one way to control the entry or loss of heat from the top of the directional solidification mold.

Figure 5:
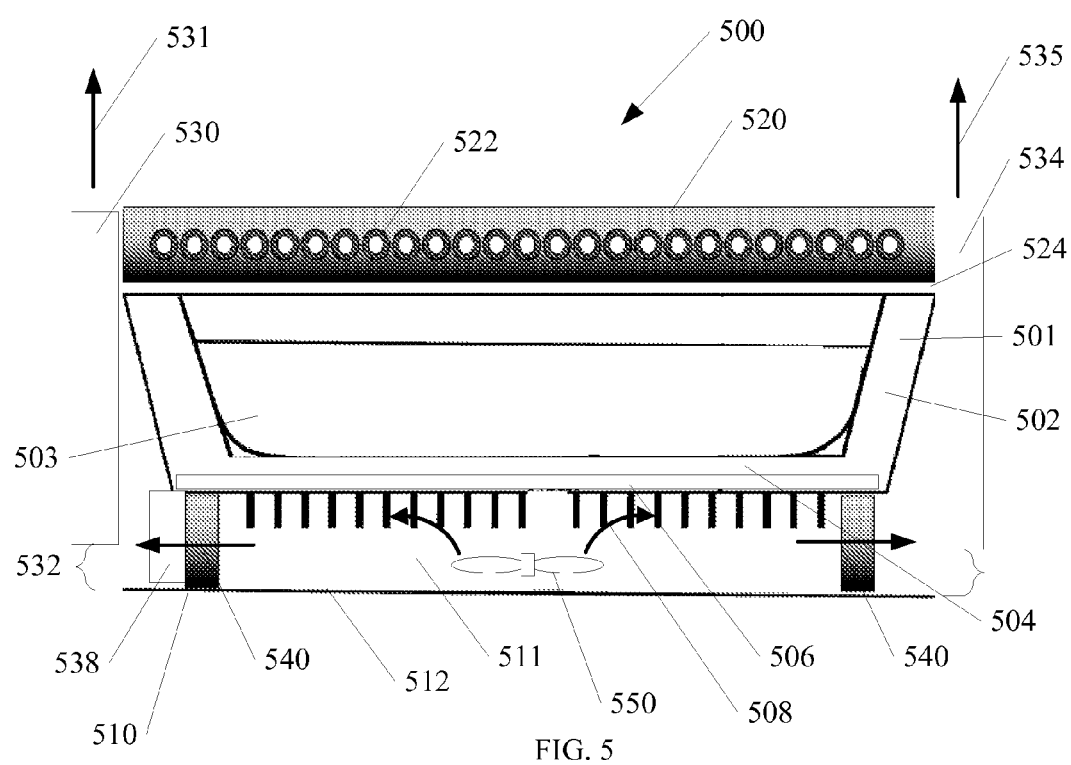
FIG. 5 shows a side view of a system according to at least one embodiment of the invention.

FIG. 5 shows a directional solidification system 500 according to an embodiment of the invention. A mold 501 is defined by a wall structure 502 and a base 504. The mold 501 is adapted to contain a volume of molten silicon 503, and to cool the molten silicon 503 in a directional solidification process. The system 500 also includes a top heater 520 to control the thermal gradient and cooling rate of the molten silicon 501. The top heater 520 is shown with a number of heating elements 522, similar to top heaters described above in other embodiments.

A support structure 510 is shown holding the mold 501 a distance above a floor surface 512 to define a space 511. In one example, a flow of air or other cooling media is controlled within the space 511 to control the rate of cooling at the base 504 of the mold 501. In one example, one or more flow pathways are provided to move air or other cooling media within the space 511. In FIG. 5, flow pathways 540 are shown. Although two flow pathways are used in selected examples, other examples include more than two flow pathway, or only a single flow pathway. A single flow pathway may serve as an inlet and an outlet at the same time.

FIG. 5 also includes an air circulation system 550 such as a fan or other active mover of air or other cooling media. In one example, the air circulation system 550 includes a horizontal fan located at approximately a center of the base 504. Also shown in FIG. 5 are a first baffle 530 and a second baffle 534. The first baffle 530 is movable in direction 531 to adjust a space 532 and provide metered access to the space 511 beneath the mold 501. Similarly, the second baffle 534 is movable in direction 535 to adjust a space 536 and provide metered access to the space 511 beneath the mold 501. In operation, one or more baffles such as baffles 530 and 534 are moved to change circulation and cooling conditions within the space 511. In one example a rate of the circulation device 538 can also be varied along with the one or more baffles such as baffles 530 and 534.

In one example, a number of cooling structures (e.g. fins) are located within the space 511 and coupled to the base 504 of the mold 501. The cooling structures increase the ability to conduct heat away from the base 504 of the mold. However, if the space 511 is closed by baffles 530 and 534, less cooling will occur at the base 504.

In one example, the base 504 includes a graphite containing layer as described in examples above. In one example, the base 504 includes a number of heat conducting layers. In one example, the base 504 further includes a silicon carbide layer as described in examples above.

In one example, a metal heat spreading layer 506 is further included at the base 504. In one example, the metal heat spreading layer 506 is located apart from the molten silicon 503. In one example, a thickness of the metal heat spreading layer 506 is just thick enough to prevent warpage due to thermal forces in heating and cooling, yet thin enough to provide good thermal conduction. In one example, the metal heat spreading layer 506 includes a layer approximately 0.75 inches thick.

In one example, heat transfer at the base 504 is limited by material choice, wherein a graphite heat containing layer provides increased heat conduction over embodiments with only silicon carbide base layers.

As shown in FIG. 5, in one example the baffles 530 and 534 include insulating walls that cover both the walls 502 of the mold 501 and optionally cover access to the space 511 beneath the mold 501. The additional coverage adjacent to the walls 502 of the mold 501 further insulates the molten silicon 503 in the region against the walls 502 and prevents less desirable solidification on the walls before solidification at the base 504. In one example the insulating walls of the baffles 530 and 534 also cover an interface 524 between the mold 501 and the top heater 520. This configuration provides additional protection against thermal loss at this interface 524. Examples of baffle materials include refractory materials or other thermally insulating materials such as those described in embodiments above.

In operation, the baffles 530 and 534 can be controlled in a number of ways. In one example the baffles 530 and 534 provide an adjustable space 532, 504 that is set once during the directional solidification process. In one embodiment, one or more baffles 530 and 534 are set to move at a continuous rate in directions 531, 535 to progressively open the pathways 540, 542. Movement of the baffles 530 and 534 may be at the same rate for each baffle, or the baffles may operate at different rates. The rate of the baffles 530 and 534 may be linear, or the rate may vary during the directional solidification process.

Figure 6:
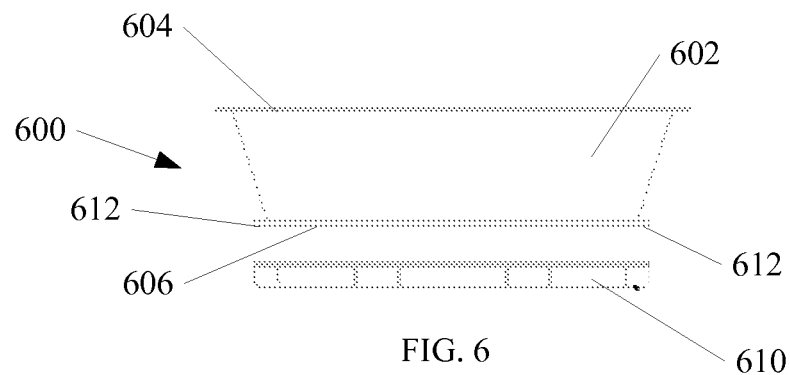
FIG. 6 shows a side view of a mold according to at least one embodiment of the invention.

By using variables such as the circulation device 538, the baffles 530 and 534, the top heater 520, the tapered wall structure 502, graphite containing layers, a metal heat spreader 506, and fins 508, a rate and profile of cooling for the molten silicon 503 can be precisely controlled. In one example, the fins 508 are radially arranged on the base 540 as shown in FIG. 6. When radial fins 508 are combined with a horizontal fan 550, increased heat transfer is possible over other fan and fin arrangements.

Control of the rate and profile of cooling provides a number of advantages, such as increased efficiency of impurity segregation. Using configurations an methods described above, silicon can be processed in fewer directional solidification steps, and larger batches of silicon can be processed to produce larger ingots with higher purity and at a faster processing rate.

FIG. 6 shows a system 600 including a mold 602 and a removable heat spreader 610. The mold 602 includes a rim 604 and a bottom 606. In some directional solidification operations, the large thermal gradients experienced by molds 602 can cause warping, and damage to heat spreading structures located on a bottom of the mold 602. If repairs are needed on a warped mold with an integral heat spreader, the entire mold must be taken out of production while it is being repaired. In the example configuration illustrated in FIG. 6, a warped or damaged removable heat spreader 610 can be removed for repair, and a spare removable heat spreader 610 can be quickly attached to keep the mold 602 available for production while the warped or damaged removable heat spreader 610 is repaired.

Figure 7:
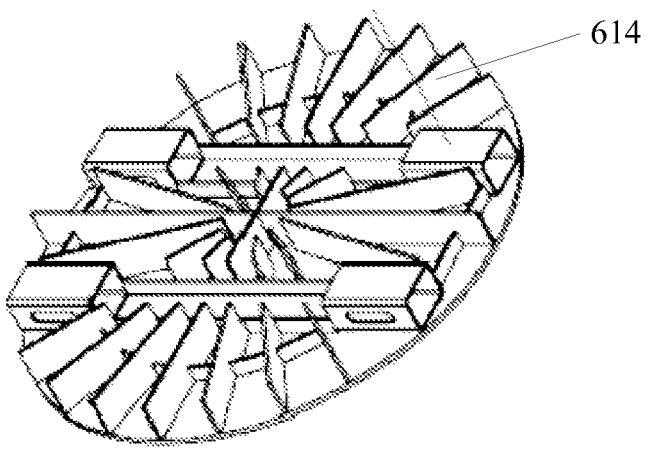
FIG. 7 shows an isometric view of a base portion of a mold according to at least one embodiment of the invention.

In FIG. 7, the removable heat spreader 610 is seen from a bottom view. In one example, a number of radial cooling fins 614 are included. In one example, a transport system, such as slots for a fork lift, or other transport system are included on the removable heat spreader 610. Attachment points 612 can be used to couple the removable heat spreader 610 to the bottom 606 of the mold 602. Examples of coupling methods include using latches, fastening hardware, or other fastening systems. Examples of fastening hardware include, but are not limited to, bolts, screws, nuts, rivets, or other suitable fastener where the removable heat spreader 610 is separately removable from the bottom 606 of the mold. In one example, a sacrificial fastener, such as a rivet, is used, wherein the removable heat spreader 610 is removed by cutting, or otherwise destroying the sacrificial fastener, and new sacrificial fasteners are used to re-attach the removable heat spreader 610. Configurations using a sacrificial fastener are easier to remove than a welded integral heat spreader, yet secure in holding the removable heat spreader 610 against the bottom 606 of the mold 602.

In addition to the ability to quickly replace a warped or damaged removable heat spreader 610, because the removable heat spreader 610 is only attached to the mold 602 at a selected number of attachment points 612, the removable heat spreader 610 is allowed a certain amount of freedom to expand and contract under thermal stress, independent of the mold 602, which reduces the cause of warping. In selected examples, the attachment points 612 include slotted, or oversized openings, which allow the removable heat spreader 610 additional freedom of movement to expand and contract around fasteners (latches, fastening hardware, etc.), independent of the mold 602.

To better illustrate the molds, mold systems, and related methods disclosed herein, a non-limiting list of examples is now provided:

Example 1 includes a system for directional solidification, including an outer mold jacket, at least one insulation layer lining a wall of the outer mold jacket, and at least one heat conducting layer lining a bottom of the outer mold jacket, wherein the at least one heat conducting layer includes a graphite containing layer.

Example 2 includes the system of example 1, wherein the at least one heat conducting layer includes a graphite containing layer adjacent to the outer mold jacket and a silicon carbide layer forming an exposed surface to contact molten silicon when in use.

Example 3 includes the system of any one of examples 1-2, wherein the silicon carbide layer is between approximately 2 to 3 inches in thickness.

Example 4 includes the system of any one of examples 1-3, wherein the silicon carbide layer includes a cast silicon carbide layer.

Example 5 includes the system of any one of examples 1-4, wherein the graphite containing layer is between approximately 1 to 2 inches in thickness.

Example 6 includes the system of any one of examples 1-5, wherein a bottom of the outer mold jacket includes a steel layer approximately 0.76 inches thick.

Example 7 includes the system of any one of examples 1-6, wherein the graphite containing layer includes a number of separate graphite bricks.

Example 8 includes the system of any one of examples 1-7, wherein the graphite containing layer includes semi graphite.

Example 9 includes a system for directional solidification, including a mold. The mold includes an outer mold jacket, at least one insulation layer lining a wall of the outer mold jacket, and at least one heat conducting layer lining a bottom of the outer mold jacket, wherein the at least one heat conducting layer includes a graphite containing layer. The system further includes a support structure spacing the mold above a floor surface, and defining a space between the mold and the floor, and an air circulation system to move air within one or more flow pathways in the space.

Example 10 includes the system of example 9, wherein the air circulation system includes a fan.

Example 11 includes the system of any one of examples 9-10, wherein the air circulation system includes horizontal fan located within the space.

Example 12 includes the system of any one of examples 9-11, further including one or more adjustable baffles to control the flow of air within the space.

Example 13 includes a system for directional solidification, including a mold. The mold includes an outer mold jacket, at least one insulation layer lining a wall of the outer mold jacket, at least one heat conducting layer lining a bottom of the outer mold jacket, wherein the at least one heat conducting layer includes a graphite containing layer, and a radially finned metal heat exchanger located on an exterior surface of a bottom of the outer mold jacket. The system also includes a support structure spacing the mold above a floor surface, and defining a space between the mold and the floor, and an air circulation system to move air within one or more flow pathways in the space.

Example 14 includes the system of example 13, wherein the radially finned metal heat exchanger includes a steel heat exchanger.

Example 15 includes the system of any one of examples 13-14, wherein radially finned metal heat exchanger is removable, and separate from the outer mold jacket.

Example 16 includes the system of any one of examples 13-15, further including a top heater.

Example 17 includes the system of any one of examples 13-16, wherein the air circulation system includes horizontal fan located within the space.

Example 18 includes the system of any one of examples 13-17, further including one or more adjustable baffles to control the flow of air within the space.

Example 19 includes a method of directional solidification, including placing an amount of molten silicon in a mold, the mold including an outer mold jacket, at least one insulation layer lining a wall of the outer mold jacket, and at least one heat conducting layer lining a bottom of the outer mold jacket, wherein the at least one heat conducting layer includes a graphite containing layer. The method further includes directionally solidifying the molten silicon as heat is conducted preferentially out the bottom of the mold.

Example 20 includes the method of example 19, wherein directionally solidifying the molten silicon includes directionally solidifying the molten silicon at a rate between approximately 1-2 centimeters per hour.

Example 21 includes the method of any one of examples 19-20, wherein directionally solidifying the molten silicon includes directionally solidifying the molten silicon at a rate between approximately 2-10 centimeters per hour.

These and other examples and features of the present molds, mold systems, and related methods will be set forth in part in the following detailed description. This overview is intended to provide non-limiting examples of the present subject matter—it is not intended to provide an exclusive or exhaustive explanation. The detailed description below is included to provide further information about the present molds, mold systems, and methods.

While a number of embodiments of the present subject matter have been described, the above embodiments are not intended to be exhaustive. It will be appreciated by those of ordinary skill in the art that any arrangement configured to achieve silicon purification using directional solidification techniques, while maintaining consistent progression of a solid-liquid interface throughout a mold can be substituted for the specific embodiment shown. Combinations of the above embodiments, and other embodiments, will be apparent to those of skill in the art upon studying the above description. This application is intended to cover any adaptations or variations of the present subject matter. It is to be understood that the above description is intended to be illustrative and not restrictive.

What is claimed is:

1. A system for directional solidification, comprising:
    a mold, including:
        an outer mold jacket;
        at least one insulation layer lining a wall of the outer mold jacket;
        at least one heat conducting layer lining a bottom of the outer mold jacket, wherein the at least one heat conducting layer includes a graphite containing layer;
        a radially finned metal heat exchanger located on an exterior surface of a bottom of the outer mold jacket, a support structure spacing the mold above a floor surface, and defining a space between the mold and the floor;
    an air circulation system to move air within one or more flow pathways in the space.

2. The system of claim 1, wherein the radially finned metal heat exchanger includes a steel heat exchanger.

3. The system of claim 1, wherein radially finned metal heat exchanger is removable, and separate from the outer mold jacket.

4. The system of claim 1, further including a top heater.

5. The system of claim 1, wherein the air circulation system includes horizontal fan located within the space.

6. The system of claim 1, further including one or more adjustable baffles to control the flow of air within the space.

* * * * *